12) United States Patent
Sato et al.

(10) Patent No.: US 7,309,881 B2
(45) Date of Patent: Dec. 18, 2007

(54) WAVELENGTH-CONVERTING LED

(75) Inventors: Hiroyuki Sato, Tokyo (JP); Shuichi Taya, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 10/900,376

(22) Filed: Jul. 28, 2004

(65) Prior Publication Data
US 2005/0035365 A1 Feb. 17, 2005

(30) Foreign Application Priority Data
Aug. 12, 2003 (JP) ............................. 2003-292196

(51) Int. Cl.
*H01L 33/00* (2006.01)
*H01L 27/15* (2006.01)
(52) U.S. Cl. ........................... 257/98; 257/81; 257/89; 257/99; 257/100
(58) Field of Classification Search .................. 257/81, 257/89, 98–100; 438/22, 24, 69–72; 313/467–468, 313/112–114, 512
See application file for complete search history.

(56) References Cited
U.S. PATENT DOCUMENTS

| 6,066,861 | A | 5/2000 | Hohn et al. | 257/99 |
| 6,245,259 | B1 | 6/2001 | Hohn et al. | 252/301.36 |
| 6,277,301 | B1 | 8/2001 | Hohn et al. | 252/301.36 |
| 6,576,930 | B2 | 6/2003 | Reeh et al. | 257/98 |
| 6,592,780 | B2 | 7/2003 | Hohn et al. | 252/301.36 |
| 6,613,247 | B1 | 9/2003 | Hohn et al. | 252/301.36 |
| 6,669,866 | B1 | 12/2003 | Kummer et al. | 252/301.4 R |
| 6,686,676 | B2 * | 2/2004 | McNulty et al. | 313/112 |
| 6,774,401 | B2 | 8/2004 | Nakada et al. | 257/82 |
| 6,809,342 | B2 | 10/2004 | Harada | 257/79 |

(Continued)

FOREIGN PATENT DOCUMENTS
EP 1 394 864 3/2004

(Continued)

OTHER PUBLICATIONS
European Search Report for European Patent Appl. No. EP 04 01 8103 (Oct. 29, 2004).

*Primary Examiner*—Ori Nadav
(74) *Attorney, Agent, or Firm*—Cermak Kenealy & Vaidya LLP

(57) ABSTRACT

A wavelength-converting LED can include a light-emitting section in which an exciting element emits a blue or ultraviolet light. A fluorescent material that has a mean particle diameter $D_{50}$ ranging from 5 μm to 20 μm and that can convert at least part of the light emitted from the exciting element into light having a wavelength longer than an exciting wavelength, can be incorporated into the LED. A dispersing agent with a mean particle diameter $D_{50}$ not less than 1/10 of the mean particle diameter $D_{50}$ of the fluorescent material is preferably incorporated in the LED. A binder base material can be arranged to contain the fluorescent material, the dispersing agent and a binder therein. The sum of the weights of the fluorescent material and the dispersing agent is preferably in the range of 20% to 60% by weight of said binder base material to prevent the fluorescent material from precipitating in the binder base material upon curing.

18 Claims, 1 Drawing Sheet

U.S. PATENT DOCUMENTS

| | | |
|---|---|---|
| 6,812,500 B2 | 11/2004 | Reeh et al. ............... 257/98 |
| 2001/0028053 A1 | 10/2001 | Hohn et al. ............ 252/301.36 |
| 2002/0195587 A1 | 12/2002 | Srivastava et al. ....... 252/301.4 |
| 2003/0015689 A1 | 1/2003 | Tomoike et al. ....... 252/301.35 |
| 2003/0227249 A1* | 12/2003 | Mueller et al. ............ 313/491 |

FOREIGN PATENT DOCUMENTS

| | | | |
|---|---|---|---|
| JP | 10-190065 | 12/1996 | |
| JP | 2001-127346 | 10/1999 | |
| JP | 2001-196639 | 1/2000 | |
| JP | 2001-210872 | 1/2000 | |
| JP | 2001-345483 | 5/2000 | |
| JP | 2000236112 | 8/2000 | |
| JP | 2004-056075 | 12/2002 | |
| JP | 2002359404 | 12/2002 | |
| WO | WO01/24229 | 4/2001 | |
| WO | WO02/086978 | 10/2002 | |
| WO | WO 02/086978 * | 10/2002 | ............. 257/100 |
| WO | WO03001612 | 1/2003 | |

* cited by examiner

WAVELENGTH-CONVERTING LED

This invention claims the benefit of Japanese patent application No. 2003-292196, filed on Aug. 12, 2003, which is hereby incorporated by reference.

BACKGROUND OF THE INVENTION

1. Field of the Invention

The present invention relates to an LED (light-emitting diode) and more particularly to an LED structure provided with a wavelength converter. The wavelength converter can produce a light emission that is different from an original light emission in terms of the color of light emitted from an LED chip. For example, the wavelength converter can excite a yellow fluorescent material with a blue light emitted from the LED chip to yield an emission of white light that is synthesized from the blue and yellow light.

2. Description of the Related Art

In a conventional wavelength-converting LED 90 configured as shown in FIG. 3, an LED chip 91 that emits, for example, a blue light is mounted on one lead frame 92 and wired to the other lead frame 93 via a gold wire 94. The LED chip 91 is entirely sealed in an epoxy resin 95 that contains a fluorescent material 96 therein.

The fluorescent material 96 has a mean particle diameter $D_{50}$ less than 5 µm as typically found in YAG:Ce, for example. Thus, only part of the blue light emitted from LED chip 91 transmits through the epoxy resin 95 and reaches the observer's eye, while the remainder of the light enters the fluorescent material 96 where it is converted into a yellow light, which reaches the observer's eye.

Accordingly, the observer receives the blue light and its complementary yellow light at the same time and recognizes them as white light. A thixotropic agent 97 may be added in the epoxy resin 95 by an appropriate amount (for example, 10% by weight) to prevent the fluorescent material 96 from precipitating before the epoxy resin 95 is cured due to a difference in specific weight. See Japanese Patent Publication No. 11-500584 (WO 98/12757), which is hereby incorporated by reference.

It has been discovered that the larger the particle diameter of the fluorescent material, the higher the wavelength conversion efficiency. This feature is shown in FIG. 2 with a curve D12 for a mean particle diameter $D_{50}$ of about 12 µm; a curve D13 for a mean particle diameter $D_{50}$ of about 13 µm; and a curve D24 for a mean particle diameter $D_{50}$ of about 24 µm. Therefore, when the mean particle diameter $D_{50}$ is set to be more than 5 µm, and preferably more than 10 µm, the wavelength-converting LED can be improved such that it has a much higher brightness.

In a practical pre-production prototype, however, the above-described precipitation of fluorescent material occurred in great quantities before the epoxy resin cured. Accordingly, even the conventional addition of the thixotropic agent to the epoxy resin is not sufficiently effective to prevent the precipitation, and allows most of the fluorescent material to precipitate. Thus, the blue and yellow lights can not be mixed sufficiently, resulting in variations of color and brightness in the light from the wavelength-converting LED. This is a problem because it is difficult to provide a wavelength-converting LED with a high brightness corresponding to an experimental value.

SUMMARY OF THE INVENTION

As one of several specified means or ways for solving the above and other conventional problems, an aspect of the present invention can include a wavelength-converting LED that has a light-emitting section. The light-emitting section can include an exciting element that emits a blue or ultraviolet light or a mixture thereof; a fluorescent material having a mean particle diameter $D_{50}$ ranging from approximately 5 µm to approximately 20 µm and operative to convert at least part of the light emitted from the exciting element into a light having a wavelength longer than an exciting wavelength; a dispersing agent having a mean particle diameter $D_{50}$ with a value not less than approximately 1/10 (one tenth) of a mean particle diameter $D_{50}$ of the fluorescent material; and a binder base material is arranged to contain the fluorescent material, the dispersing agent and a binder therein. The sum of the weights of the fluorescent material and the dispersing agent is in the range of approximately 20% to approximately 60% by weight of the binder base material.

Another aspect of the invention includes a wavelength-converting LED comprising a light-emitting section. The light-emitting section can include an exciting element operative to emit a blue or ultraviolet light or a mixture thereof; a fluorescent material having a mean particle diameter $D_{50}$ ranging from approximately 5 µm to approximately 15 µm and operative to convert at least part of the light emitted from the exciting element into a light having a wavelength longer than an exciting wavelength; a dispersing agent having a mean particle diameter with a value not greater than approximately 1/100 (one hundredth) of the mean particle diameter $D_{50}$ of the fluorescent material; and a binder base material is arranged to contain the fluorescent material, the dispersing agent and a binder therein. The sum of the weights of the fluorescent material and the dispersing agent is preferably not more than approximately 50% by weight of the binder base material.

The addition of the dispersing agent can prevent the fluorescent material from precipitating in a binder base material containing a binder, e.g. an epoxy resin. Accordingly, even when the fluorescent material has a large particle diameter, it can be dispersed uniformly in the binder base material. Thus, it is possible to retain uniformity in the mixed color that results from the light from the exciting element mixed with the light from the excited fluorescent material. This is effective to achieve a wavelength-converting LED with a much higher brightness.

Another aspect of the invention includes a wavelength-converting LED that has a housing and an exciting element located in the housing and configured to emit a blue light, an ultraviolet light or mixture thereof. Means for converting the light emitted from the exciting element from a first wavelength to a second wavelength that is different from the first wavelength can also be provided. The means for converting can be located adjacent the exciting element and include a binder base material, a fluorescent material having a mean particle diameter $D_{50}$ ranging from approximately 5 µm to approximately 20 µm, and a dispersing agent having a mean particle diameter $D_{50}$ that is not less than approximately 1/10 (one tenth) of the mean particle diameter $D_{50}$ of the fluorescent material.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The present invention will be more fully understood from the following detailed description with reference to the accompanying drawings, in which.

DETAILED DESCRIPTION OF PREFERRED EMBODIMENTS

Figure 1:
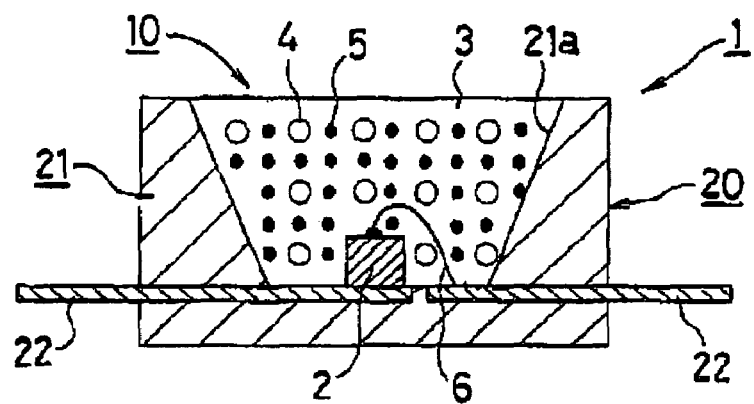
FIG. 1 is a cross-sectional view showing a preferred embodiment of a wavelength-converting LED made in accordance with the principles of the invention.
Figure 2:
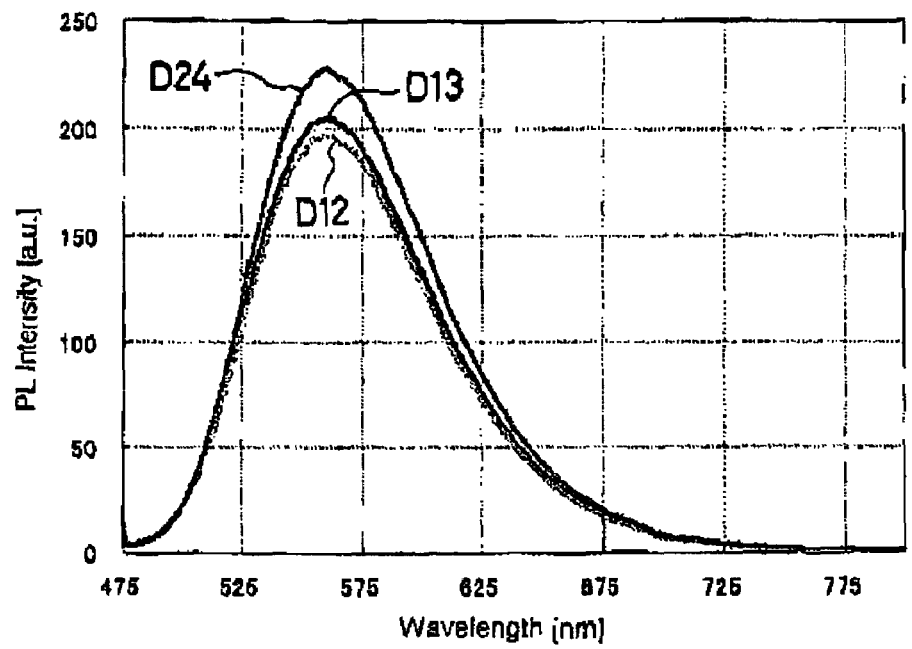
FIG. 2 is a graph showing a relationship between particle diameters of the fluorescent material and the amount of light.
Figure 3:
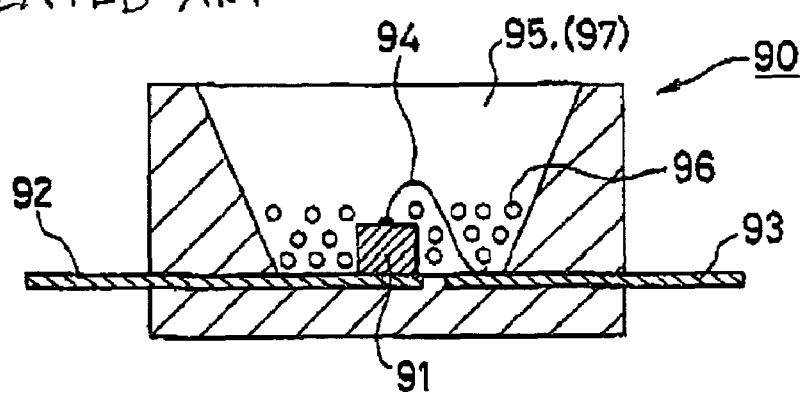
FIG. 3 is a cross-sectional view showing a conventional art wavelength-converting LED.

The present invention will now be described in detail based on preferred embodiments, including the preferred embodiment shown in the drawings. In FIG. 1 the reference numeral 1 denotes a wavelength-converting LED made in accordance with the principles of the invention. The wavelength-converting LED 1 preferably includes a light-emitting section 10 and a package or housing 20 employed to support the light-emitting section 10.

The package 20 can include a casing 21, preferably composed of a resinous material and shaped to have a conical recess 21a therein, and a pair of leads 22 each having a surface exposed in the bottom of the recess 21a. The light-emitting section 10 can be housed in the recess 21a. While the so-called chip type LED is described herein, other packages may also be employed in the present invention, especially as far as an exciting element 2 is arranged to emit light in a recess 21a that receives a binder base material 3 containing a fluorescent material 4 and a dispersing agent 5 cast or injected therein. For example, a package generally referred to as a shell type LED and a large chip package that is typically used with a large driving current may be employed without affecting the gist of the invention.

The light-emitting section 10 can include an exciting element 2 such as an LED chip, a binder base material 3 containing a binder such as an epoxy resin and the like, a fluorescent material 4, and a dispersing agent 5. The exciting element 2 can be die-mounted on one of the leads 22 exposed in the bottom of the recess 21a by using a conductive adhesive, solder, or Au—Sn eutectic agent, and connected to the other of the leads 22 via a gold wire 6. Another method of mounting the exciting element may be by forming electrodes of both polarities on one surface of the exciting element 2, securing the element using an adhesive, and electrically contacting the electrodes to the corresponding leads 22 using gold wires. A further method employs a conductive adhesive, solder, Au—Sn eutectic agent, or Au bump to secure the exciting element 2 while electrically contacting the electrodes formed on one surface of the exciting element 2 to the corresponding leads 22.

The exciting element 2 may be any element that can emit a blue light or a light with a shorter wavelength than blue, including blue or ultraviolet light. Generally, it includes a layer of $Mg_xZn_{1-x}O$ or $In_xAl_yGa_{(1-x-y)}N$. The binder in the binder base material 3 may be a material that can also physically and chemically protect the exciting element 2, the gold wire 6 and the fluorescent material 4, and allow visible light to pass therethrough. Specifically, it may contain at least one resin selected among an epoxy resin, a silicone resin, a polydimethylsiloxane derivative having an epoxy group, an oxetane resin, an acrylic resin, and a cycloolefin resin.

The fluorescent material 4 may be a material that can emit light that is excited by, and whose wavelength is lengthened by, the light from the exciting element 2. For example, it may be $A_3B_5O_{12}$:M(A: Y, Gd, Lu, Tb; B: Al, Ga; M: $Ce^{3+}$, $Tb^{3+}$, $Eu^{3+}$, $Cr^{3+}$, $Nd^{3+}$, $Er^{3+}$); a thiogallate fluorescent material doped with a rare earth element; or a fluorescent material containing at least one composition of an aluminate $ABO_3$:M(A: Y, Gd, Lu, Tb; B: Al, Ga; M: $Ce^{3+}$, $Tb^{3+}$, $Eu^{3+}$, $Cr^{3+}$, $Nd^{3+}$, $Er^{3+}$) or an orthosilicate $(Ba, Ca, Eu)_xSi_yO_z$:$Eu^{2+}$.

When the exciting element 2 emits a blue light and it is desired that the wavelength-converting LED 1 provide a white emission, the fluorescent material 4 having a yellow emission complementary to the blue emission from the exciting element 2 can be combined to obtain a total white emission. Fluorescent materials which emit green and red when they are excited by the blue light emitted from the exciting element 2 may also be appropriately mixed to obtain the fluorescent materials 4 that can be combined to achieve a white emission. Further, if the exciting element 2 emits an ultraviolet light, the emission from the exciting element 2 can yield a white emission in combination with fluorescent materials 4 having the three primary colors R (Red), G (Green) and B (Blue).

Preferably, the dispersing agent 5 does not cause a loss of light from the exciting element 2. Accordingly, the dispersing agent 5 may be a colorless transparent material or a material having a high reflectance relative to light. For example, it may be a silicon dioxide (highly reflective), an aluminum oxide (highly reflective), an epoxy resin (transparent), a barium sulfate (highly reflective), a calcium carbonate (highly reflective), a barium oxide (highly reflective), and a titanium oxide (highly reflective).

As described above, for improving characteristics of the wavelength-converting LED 1 and in order for the LED 1 to exhibit a higher brightness, the particle diameter of the fluorescent material 4 may be made not less than 5 μm for the mean particle diameter $D_{50}$. If it exceeds 20 μm, however, precipitation of the fluorescent material 4 during the process of curing or solidifying the binder base material 3 may occur. Therefore, it is preferable that the particle diameter of the fluorescent material 4 in the present invention be contained in the range of 5 μm to 20 μm for the mean particle diameter $D_{50}$.

Addition of the dispersing agent 5 instead of the thixotropic agent can help prevent the precipitation of the fluorescent material 4. A preferred embodiment of the present invention is designed to prevent the precipitation of fluorescent material by adding an appropriate amount of the originally solid dispersing agent 5. In this case, the dispersing agent 5 enters between the particles of the fluorescent material 4 to restrict free movement of the fluorescent material 4 in the binder base material 3 or liquid-like material.

Various conditions of the dispersing agent 5 have been studied in order to satisfy the above matter. Consequently, it is found that the dispersing agent 5 is preferably colorless and transparent, or has a high reflectance so that the dispersing agent 5 itself can not absorb the light from the exciting element 2. It is also found as a trend in the above situation that the smaller the particle diameter of the dispersing agent 5 is, the lower the loss in the amount of light becomes.

If the mean particle diameter $D_{50}$ of the dispersing agent 5 is not smaller than 1/10 (one tenth) of that of the fluorescent material 4, precipitation of the fluorescent material 4 can be reduced significantly. Therefore, the mean particle diameter $D_{50}$ of the dispersing agent 5 ranges from 1/10 (one tenth) of the mean particle diameter $D_{50}$ of the fluorescent material 4, more desirably, from 1/5 (one fifth) of that of the fluorescent material 4 to the same mean particle diameter $D_{50}$ of the fluorescent material 4. As later mentioned, even in case that the mean particle diameter of the dispersing agent is 1/100 (one hundredth) or bellow of the particle diameter of the fluorescent material, the effect of reducing precipitation of the fluorescent material can also be expected. This effect can be expected only for the fluorescent material whose diameter ranges 5 μm to 15 μm. Such smaller dispersing agents are exemplified by so-called nano-particles of 150 nm.

The amount of fluorescent material 4 in use differs greatly depending on its type and so forth. Accordingly, the amount of the dispersing agent 5 added in the binder base material 3 is determined as part of a total value summed with the fluorescent material 4 to meet each particular situation. When a large amount of fluorescent material 4 is added in the binder base material 3, addition of a small amount of the dispersing agent 5 may be considered to be sufficient to prevent the fluorescent material 4 from precipitating.

In a preferred embodiment, the total amounts of the fluorescent material 4 and the dispersing agent 5 added to the binder base material 3 is in the range of 20% to 60% by weight of the binder base material. An amount below this range (less than 20 wt. %) typically does not exhibit a substantial precipitation preventing effect. An amount above this range (more than 60 wt. %) makes it difficult to add and blend the mixture of fluorescent material 4 and dispersing agent 5 in the binder base material 3.

It has also been found that the use of a dispersing agent 5 with a mean particle diameter not greater than 1/100 (one hundredth) of those of the fluorescent material (e.g., below 150 nm), such as generally-called nano-particles, can achieve the same action and effect on suppressing the precipitation of the fluorescent material 4 as above. This nano-particles case is limited only when the mean particle diameter $D_{50}$ of the fluorescent material 4 is not greater than 15 μm for mean particle diameter. Its lower limit of the fluorescent material 4 is 5 μm from the standpoint of high brightness of LED. The nano-particle dispersing agent typically has a lower limit of a mean particle diameter of 1 nm. The nano-particle dispersing agent has a significant effect on the suppression of precipitation even in an addition of a small amount thereof while also affecting an increase in viscosity of a mixture. Therefore, its mixing amount in sum, including the fluorescent material in total, is preferably 50% or less by weight of the binder base material.

When such a nano-particle dispersing agent 5 is employed, as the nano-particle's particle diameter becomes smaller than the wavelengths of visible light, the dispersing agent 5 can have a negligible optical effect on the region of white light emitted from the wavelength-converting LED 1. For example, the problems caused from the addition of the dispersing agent 5, such as colored light emission or loss in the amount of light due to partial wavelength absorption, can be minimized.

EXAMPLE I

In the recess 21a of the casing 21, a GaN exciting element 2 can be die-mounted on the lead 22 with a silver paste and wired via the gold wire 6. Then, an orthosilicate fluorescent material 4 ($D_{50}$: 12 μm) of 20 wt. % and a $SiO_2$ dispersing agent 5 ($D_{50}$: 5 μm) of 20 wt. %, in total 40 wt. %, can be dispersed in a binder base material 3 containing an epoxy resin binder, and the resultant mixture are cast into the recess 21a. The sum of percents by weight of the fluorescent material 4, the dispersing agent 5 and the epoxy resin binder equals 100% by weight.

The wavelength-converting LED 1 produced through the above processes has a chromaticity coordinate of (0.33, 0.35) and its overall beam is 1.55 lm when it is driven at 20 mA and 4V. Variations of brightness and color are not determinable. It is found that a highly efficient wavelength-converting LED 1 utilizing an increased particle diameter for the fluorescent material 4 can be achieved by the addition of an appropriate amount of dispersing agent 5.

EXAMPLE II

In the recess 21a of the casing 21, a GaN exciting element 2 can be die-mounted on the lead 22 with a silver paste and wired via the gold wire 6. Then, an orthosilicate fluorescent material 4 ($D_{50}$: 12 μm) of 21 wt. % and a $SiO_2$ dispersing agent 5 (nano-particle with a mean particle diameter of about 7 nm) of 5 wt. %, in total 26 wt. %, can be dispersed in a binder base material 3 containing an epoxy resin binder, and the resultant mixture is cast into the recess 21a. The sum of the percents by weight of the fluorescent material 4, the dispersing agent 5 and the epoxy resin binder equals 100% by weight.

The wavelength-converting LED 1 produced through the above process has a chromaticity coordinate of (0.32, 0.34) and its overall beam is 1.64 lm when it is driven at 20 mA and 4V. Variations of brightness and color are not determinable. It is found that a highly efficient wavelength-converting LED 1 utilizing an increased particle diameter for the fluorescent material 4 can be achieved by the addition of an appropriate amount of nano-particle dispersing agent 5.

The mean particle diameter $D_{50}$ of the fluorescent material according to the present invention can be measured using a laser diffractive scattered particle distribution measuring method for the mean particle diameters on the order of μm. Alternatively, for the mean particle diameters on the order of nm, readings on each particle diameters of 3,000-pieces of sample particle images extracted from SEM (Scanning Electron Microscope) photos thereof can be averaged to calculate the mean particle diameters.

The present invention can be used as a backlight for color LCD displays employed in personal computers and cell phones. The invention is also widely applicable for almost any use that requires a white light source, such as an illumination light source for homes or vehicles, as well as many other applications.

Having described preferred embodiments consistent with the invention, other embodiments and variations consistent with the invention will be apparent to those skilled in the art. Therefore, the invention should not be viewed as limited to the disclosed preferred embodiments but rather should be viewed as limited only by the spirit and scope of the appended claims.

What is claimed is:

1. A wavelength-converting LED, comprising:
   an exciting element configured to emit one of a blue light having an exciting wavelength and an ultraviolet light having an exciting wavelength;
   a fluorescent material located adjacent the exciting element and having a mean particle diameter ranging from 5 μm to 20 μm, the fluorescent material being capable of converting at least part of said light emitted from said exciting element into a light having a wavelength that is longer than said exciting wavelength;

a dispersing agent located adjacent the exciting element and having a mean particle diameter that is not less than 1/10 (one tenth) of said mean particle diameter of said fluorescent material; and a binder base material being arranged to include said fluorescent material, said dispersing agent and a binder therein, wherein a sum of the weights of said fluorescent material and said dispersing agent is in the range of 20% to 60% by weight of said binder base material.

2. The wavelength-converting LED according to claim 1, wherein said binder includes at least one resin selected among an epoxy resin, a silicone resin, a polydimethylsiloxane derivative having an epoxy group, an oxetane resin, an acrylic resin, and a cycloolefin resin.

3. The wavelength-converting LED according to claim 1, wherein said exciting element includes one of a layer of $Mg_xZn_{1-x}O$ and a layer of $In_xAl_yGa_{(1-x-y)}N$.

4. The wavelength-converting LED according to claim 1, wherein said dispersing agent includes at least one of a silicon dioxide, an aluminum oxide, a barium sulfate, a calcium carbonate, a barium oxide, and a titanium oxide.

5. The wavelength-converting LED according to claim 1, wherein said fluorescent material includes one of a YAG fluorescent material doped with a rare earth element; a thiogallate fluorescent material doped with a rare earth element; a fluorescent material containing at least one of an aluminate and an orthosilicate; a barium-aluminum-magnesium compound fluorescent material doped with a rare earth element; and a sulfide compound fluorescent material.

6. The wavelength-converting LED according to claim 2, wherein said exciting element includes one of a layer of $Mg_xZn_{1-x}O$ and a layer of $In_xAl_yGa_{(1-x-y)}N$.

7. The wavelength-converting LED according to claim 2, wherein said dispersing agent includes at least one of a silicon dioxide, an aluminum oxide, a barium sulfate, a calcium carbonate, a barium oxide, and a titanium oxide.

8. The wavelength-converting LED according to claim 3, wherein said dispersing agent includes at least one of a silicon dioxide, an aluminum oxide, a barium sulfate, a calcium carbonate, a barium oxide, and a titanium oxide.

9. The wavelength-converting LED according to claim 2, wherein said fluorescent material consists of one of a YAG fluorescent material doped with a rare earth element; a thiogallate fluorescent material doped with a rare earth element; a fluorescent material containing at least one of an aluminate and an orthosilicate; a barium-aluminum-magnesium compound fluorescent material doped with a rare earth element; and a sulfide compound fluorescent material.

10. The wavelength-converting LED according to claim 3, wherein said fluorescent material consists of one of a YAG fluorescent material doped with a rare earth element; a thiogallate fluorescent material doped with a rare earth element; a fluorescent material containing at least one of an aluminate and an orthosilicate; a barium-aluminum-magnesium compound fluorescent material doped with a rare earth element; and a sulfide compound fluorescent material.

11. The wavelength-converting LED according to claim 4, wherein said fluorescent material consists of one of a YAG fluorescent material doped with a rare earth element; a thiogallate fluorescent material doped with a rare earth element; a fluorescent material containing at least one of an aluminate and an orthosilicate; a barium-aluminum-magnesium compound fluorescent material doped with a rare earth element; and a sulfide compound fluorescent material.

12. The wavelength-converting LED according to claim 1, further comprising:

a light emitting section, wherein the exciting element, fluorescent material and dispersing agent are located in the light emitting section.

13. A wavelength-converting LED comprising:

an exciting element configured to emit one of a blue light having an exciting wavelength and an ultraviolet light having an exciting wavelength;

a fluorescent material having a mean particle diameter $D_{50}$ ranging from 5 μm to 15 μm and configured to convert at least part of said light emitted from said exciting element into a light having a wavelength that is longer than said exciting wavelength;

a dispersing agent having a mean particle diameter that is not greater than 1/100 (one hundredth) of said mean particle diameter of said fluorescent material; and a binder base material being arranged to include said fluorescent material, said dispersing agent and a binder therein, wherein a sum of the weights of said fluorescent material and said dispersing agent is not greater than 50% by weight of said binder base material.

14. The wavelength-converting LED according to claim 13, wherein said binder includes at least one resin selected among an epoxy resin, a silicone resin, a polydimethylsiloxane derivative having an epoxy group, an oxetane resin, an acrylic resin, and a cycloolefin resin.

15. The wavelength-converting LED according to claim 13, wherein said exciting element includes one of a layer of $Mg_xZn_{1-x}O$ and a layer of $In_xAl_yGa_{(1-x-y)}N$.

16. The wavelength-converting LED according to claim 13, wherein said dispersing agent includes at least one of a silicon dioxide, an aluminum oxide, a barium sulfate, a calcium carbonate, a barium oxide, and a titanium oxide.

17. The wavelength-converting LED according to claim 13, wherein said fluorescent material includes one of a YAG fluorescent material doped with a rare earth element; a thiogallate fluorescent material doped with a rare earth element; a fluorescent material containing at least one of an aluminate and an orthosilicate; a barium-aluminum-magnesium compound fluorescent material doped with a rare earth element; and a sulfide compound fluorescent material.

18. The wavelength-converting LED according to claim 13, further comprising:

a light emitting section, wherein the exciting element, fluorescent material and dispersing agent are located in the light emitting section.

* * * * *